(12) United States Patent
Chen et al.

(10) Patent No.: US 9,029,984 B2
(45) Date of Patent: May 12, 2015

(54) SEMICONDUCTOR SUBSTRATE ASSEMBLY

(71) Applicant: Industrial Technology Research Institute, Hsinchu (TW)

(72) Inventors: Peng-Shu Chen, New Taipei (TW); Min-Lin Lee, Hsinchu (TW); Shih-Hsien Wu, Taoyuan County (TW); Shur-Fen Liu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/797,366

(22) Filed: Mar. 12, 2013

(65) Prior Publication Data

US 2014/0048908 A1 Feb. 20, 2014

(30) Foreign Application Priority Data

Aug. 15, 2012 (TW) .............................. 101129625 A (51) Int. Cl.
| | |
|---|---|
| *H01L 29/00* | (2006.01) |
| *H01L 23/48* | (2006.01) |
| *H01L 23/64* | (2006.01) |
| *H01L 23/66* | (2006.01) |
| *H01L 25/065* | (2006.01) |

(Continued)

(52) U.S. Cl.
CPC .............. *H01L 23/48* (2013.01); *H01L 23/481* (2013.01); *H01L 23/64* (2013.01); *H01L 23/66* (2013.01); *H01L 25/0657* (2013.01); *H01L 2225/06513* (2013.01); *H01L 2225/06541* (2013.01); *H01L 2924/0002* (2013.01); *H01L 2224/0401* (2013.01); *H01L 2224/05009* (2013.01); *H01L 2224/06181* (2013.01); *H01L 2224/13111* (2013.01); *H01L 2224/16145* (2013.01); *H01L 2224/16146* (2013.01); *H01L 2224/16225* (2013.01); *H01L 2224/16235* (2013.01); *H01L 2224/81192* (2013.01); *H01L 23/49827* (2013.01); *H01L 23/5223* (2013.01); *H01L 21/02107* (2013.01)

(58) Field of Classification Search
USPC ................................................... 257/536, 537
See application file for complete search history.

(56) References Cited

U.S. PATENT DOCUMENTS

| | | | |
|---|---|---|---|
| 7,691,747 | B2 | 4/2010 | Lin et al. |
| 7,741,152 | B2 | 6/2010 | Huang et al. |

(Continued)

OTHER PUBLICATIONS

Song et al., A Wide-Band Passive Equalizer Design on PCB Based on Near-End Crosstalk and Reflections for 12.5 Gbps Serial Data Transmission, IEEE Microwave and Wireless Components Letters, 2008, vol. 18, No. 12, pp. 794-796.

(Continued)

*Primary Examiner* — Thien F Tran
(74) *Attorney, Agent, or Firm* — Tim Tingkang Xia, Esq.; Morris, Manning & Martin, LLP (57) ABSTRACT

A semiconductor substrate assembly is proposed. The semiconductor interposer comprises a substrate having a first surface and a second surface opposite to the first surface, a first conductive pad, a second conductive pad and a conductive pillar. The first conductive pad is formed at a predetermined location of the first surface of the substrate. The second conductive pad is formed at a predetermined location of the second surface of the substrate as compared with the position of the first conductive pad. The conductive pillar is formed in the substrate and contacts with one of the first conductive pad and the second conductive pad.

11 Claims, 7 Drawing Sheets

(51) Int. Cl.
*H01L 23/498* (2006.01)
*H01L 23/522* (2006.01)
*H01L 21/02* (2006.01)

(56) References Cited

U.S. PATENT DOCUMENTS

| | | |
|---|---|---|
| 7,772,081 B2 | 8/2010 | Lin et al. |
| 7,799,678 B2 | 9/2010 | Kropewnicki et al. |
| 7,863,106 B2 | 1/2011 | Christo et al. |
| 8,021,926 B2 | 9/2011 | de Fresart et al. |
| 8,133,762 B2 * | 3/2012 | Pagaila et al. ............ 438/117 |
| 2009/0267194 A1 | 10/2009 | Chen |
| 2010/0148316 A1 * | 6/2010 | Kim et al. ............ 257/621 |
| 2011/0027962 A1 | 2/2011 | Bernstein et al. |
| 2011/0108948 A1 | 5/2011 | Kim et al. |
| 2011/0215457 A1 | 9/2011 | Park |
| 2011/0233785 A1 | 9/2011 | Koester et al. |

OTHER PUBLICATIONS

Kim et al., Through Silicon Via (TSV) Equalizer, IEEE 18th Conference on Electrical Performance of Electronic Packaging and Systems, 2009, EPEPS '09, pp. 19-21.

Sun et al., RC Passive Equalizer for Through Silicon Via, IEEE 19th Conference on Electrical Performance of Electronic Packaging and Systems, 2010, EPEPS2010, pp. 45-48.

Sun et al., Passive Equalizer Design for Through Silicon Vias with Perfect Compensation, IEEE Transactions on Components, Packaging and Manufacturing Technology, 2011, vol. 1, No. 11, pp. 1815-1822.

Salah et al., Compact lumped element model for TSV in 3D-Ics, 2011 IEEE International Symposium on Circuits and Systems (ISCAS), 2011, pp. 2321-2324.

* cited by examiner

FIG.9

# SEMICONDUCTOR SUBSTRATE ASSEMBLY

CROSS-REFERENCE STATEMENT

This non-provisional application claims priority under 35 U.S.C. §119(a) on Patent Application No(s). 101129625 filed in Taiwan, R.O.C. on Aug. 15, 2012, the entire contents of which are hereby incorporated by reference.

BACKGROUND

1. Technical Field

The disclosure relates to a semiconductor substrate assembly.

2. Related Art

To fulfill the high density package and to improve the channel bandwidth of the high speed integrated circuit system, a through-silicon via (TSV) is a key point in the three dimension integrated circuit (3D ICs) technique. In the integrated circuit technique of the 3D ICs, the TSV package technique is a main central technique and is available to connect a chip to one another vertically. This may reduce the length of connection lines greatly. Moreover, a silicon semiconductor interposer technique is also required in the outside connection of the 3D ICs, provides two dimension connection line layers, and provides three dimension connection lines among a plurality of laminated chips. For a high speed digital device implementing the 3D ICs, the TSVs and the semiconductor interposers are required to provide a wider bandwidth and to be small, and whereby the high speed digital device may have a high performance and a minimized size.

The TSV is insulated from the silicon substrate by a dielectric layer. This dielectric layer and the body of the semiconductor chip may cause a capacitance effect without ignoring therebetween according to the electric conductivity of the body. The capacitance effect and the silicon carrier with normal wear and tear may cause the distortion of high speed signal according to the variation of the frequency of the signal. To improve that signals in the high speed signal channel decay with the variation of the frequency thereof, the equalization circuit is implemented to reduce the transmission loss.

The present 3D IC technique may face non-linear signal transmission loss caused by the TSV, when transmitting signal through the TSV formed in the chip. The non-linear signal transmission loss may cause the signal distortion in high speed signal transmission, e.g. 20 Gbps or 25 Gbps. It may reduce the signal distortion to use the equalization circuit which provides a frequency response to transmission lines.

Generally, the passive equalization circuit requires resistance elements and capacitance elements. Such resistance elements and capacitance elements are belonged to additional materials and additional fabrication process in the design and manufacture of the chip, and this may cause the additional circuit design, fabrication process and area of the chip. Moreover, the equalization circuit of the silicon chip may occupy the more area of the chip and thereby increasing the costs and the design difficulty.

SUMMARY

This disclosure provides a semiconductor substrate or a substrate, which uses a chip semiconductor, a silicon semiconductor or a silicon semiconductor interposer as the basis to form resistance elements and capacitance elements.

According one embodiment of the disclosure, a semiconductor substrate assembly includes a substrate, a first conductive pad, a second conductive pad and a conductive pillar. The substrate has a first surface and a second surface opposite to the first surface. The first conductive pad is formed at a predetermined location of the first surface of the substrate. The second conductive pad is formed at a predetermined location of the second surface of the substrate. The predetermined location of the second surface corresponds to the position of the first conductive pad. The conductive pillar is formed in the substrate and contacts with one of the first conductive pad and the second conductive pad.

According other embodiment of the disclosure, a semiconductor substrate assembly includes a substrate, a first conductive pad, a second conductive pad, a third conductive pad, a first insulation layer, a third insulation layer and a fourth insulation layer. The substrate has a first surface and a second surface opposite to the first surface. The first conductive pad is formed at a predetermined location of the first surface of the substrate. The second conductive pad is formed at a predetermined location of the second surface of the substrate. The predetermined location of the second surface corresponds to the position of the first conductive pad. The third conductive pad is formed at the second surface of the substrate. The first conductive pillar is formed in the substrate and electrically connects to one of the first conductive pad and the third conductive pad. The first insulation layer is formed around the first conductive pillar. The third insulation layer is formed at remaining portion of the first surface of the substrate. The fourth insulation layer is formed at remaining portion of the second surface of the substrate.

According other embodiment of the disclosure, a semiconductor substrate assembly includes a substrate, a first conductive pad, a second conductive pad, a third conductive pad, a first conductive pillar, a dielectric layer, a first insulation layer, a third insulation layer and a fourth insulation layer. The substrate has a first surface and a second surface opposite to the first surface. The first conductive pad is formed at a predetermined location of the first surface of the substrate. The first conductive pillar is formed in the substrate and electrically connects to the first conductive pad. The second conductive pad is formed at a predetermined location of the second surface of the substrate. The predetermined location of the second surface corresponds to the position of the first conductive pillar. The dielectric layer is formed on the second conductive pad. The third conductive pad is formed on the second surface of the substrate and on the dielectric layer. The first insulation layer is formed around the first conductive pillar. The third insulation layer is formed at remaining portion of the first surface of the substrate. The fourth insulation layer is formed at remaining portion of the second surface of the substrate.

For purposes of summarizing, some aspects, advantages and features of some embodiments of the disclosure have been described in this summary. Not necessarily all of (or any of) these summarized aspects, advantages or features will be embodied in any particular embodiment of the disclosure. Some of these summarized aspects, advantages and features and other aspects, advantages and features may become more fully apparent from the following detailed description and the appended claims.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

The detailed features and advantages of the disclosure are described below in great detail through the following embodiments, the content of which is sufficient for those of ordinary skill in the art to understand the technical content of the disclosure and to implement the disclosure accordingly. Based upon the content of the specification, the claims, and the drawings, those of ordinary skill in the art can easily understand the relevant objectives and advantages of the disclosure.

Figure 1:
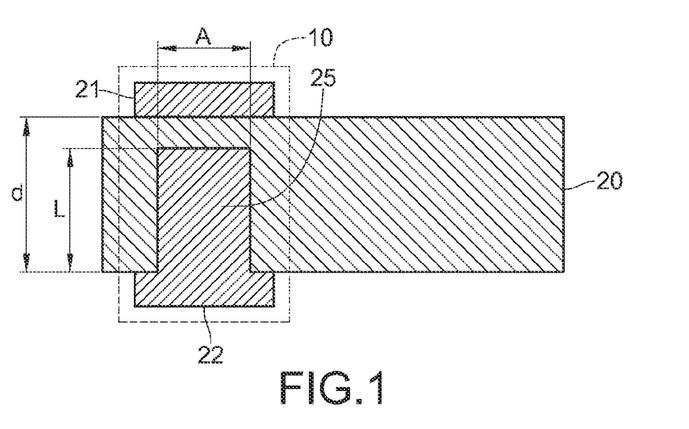
FIG. 1 is a schematic diagram of a semiconductor substrate assembly according to one embodiment of the disclosure.

FIG. 1 illustrates a schematic diagram of a semiconductor substrate assembly according to one embodiment of the disclosure. The semiconductor substrate assembly includes a substrate 20. In one embodiment, the substrate 20 may be a silicon substrate. In one embodiment, the silicon substrate is a chip semiconductor, a silicon semiconductor, or a silicon semiconductor interposer.

A first conductive pad 21 is formed at a predetermined location of a first surface of the substrate 20. A second conductive pad 22 is formed at a predetermined location of a second surface of the substrate. The predetermined location of the second surface corresponds to the position of the first conductive pad 21, and is extended to form a conductive pillar 25 by a buried-hole manner. The distance between the first conductive pad 21 and the conductive pillar 25 is from 5 to 10 micrometer. The conductive pillar 25 is made of metal.

A resistance element 10 is formed among the first conductive pad 21, the second conductive pad 22, the conductive pillar 25 and the substrate 20 overlapped between the first conductive pad 21 and the conductive pillar 25. The resistance value R of the resistance element 10 is defined as follows:

$$R=\rho((d-L)/A)$$

where, d is the thickness of the substrate 20, L is the length of the conductive pillar 25, A is a cross-sectional area of the conductive pillar 25, and ρ is the conductivity of the substrate 20. By changing the above parameters, various resistance values R may be calculated to satisfy various application requests. In one embodiment based on the fixed parameters ρ, d and A, and the resistance value R is reduced while the length L is increased. When the length L is zero, the resistance value R is changed according to the thickness of the substrate 20.

To simplifying the diagrams of the disclosure in following embodiments, the parameters in the equation are not marked in the diagrams. When the following description mentions similar parameters, these similar parameters correspond to the parameters of the equation. Otherwise, the conductive pillar 25 may be formed by extending the first conductive pad 21 in other embodiment.

Figure 2A:
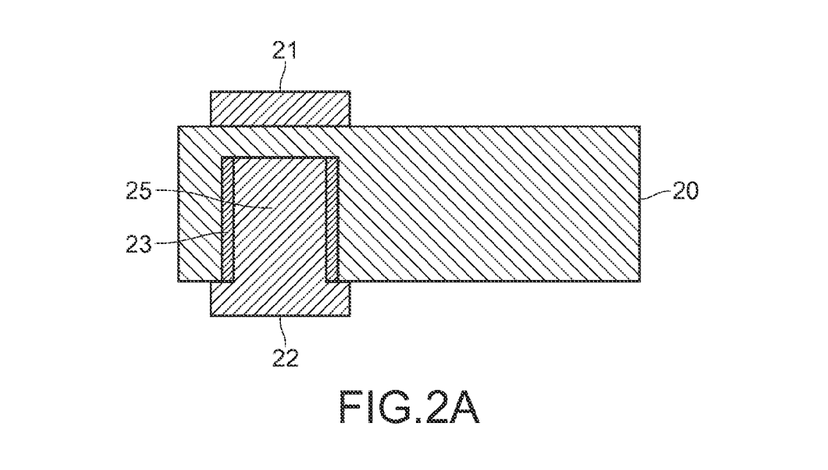
FIG. 2A and FIG. 2B are schematic diagrams of a semiconductor substrate assembly according to other embodiments of the disclosure.

In other embodiment, when a blind hole or a via of signal line is formed at a location near the conductive pillar 25, an insulation layer 23 may be further formed around the conductive pillar 25 of FIG. 1 to avoid electrical interference around the conductive pillar 25 as shown in FIG. 2A. The distance between the first conductive pad 21 and the conductive pillar 25 is from 5 to 10 micrometer.

Figure 2B:
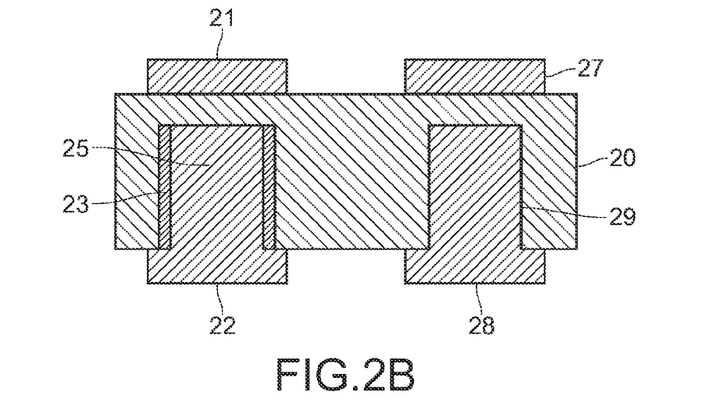

In other embodiment, another resistance element may be further formed near the conductive pillar 25 of FIG. 2A as shown in FIG. 2B. The structure of another resistance element is equal to that of the resistance element 10 of FIG. 1. A first conductive pad 27 is formed at another predetermined location of the first surface of the substrate 20. A second conductive pad 28 is formed at a predetermined location of the second surface of the substrate 20. The predetermined location of the second surface corresponds to the position of the first conductive pad 27. The second conductive pad 28 is extended to form a conductive pillar 29 by the buried-hole manner. The distance between the first conductive pad 21 and the conductive pillar 25 is from 5 to 10 micrometer.

Figure 3:
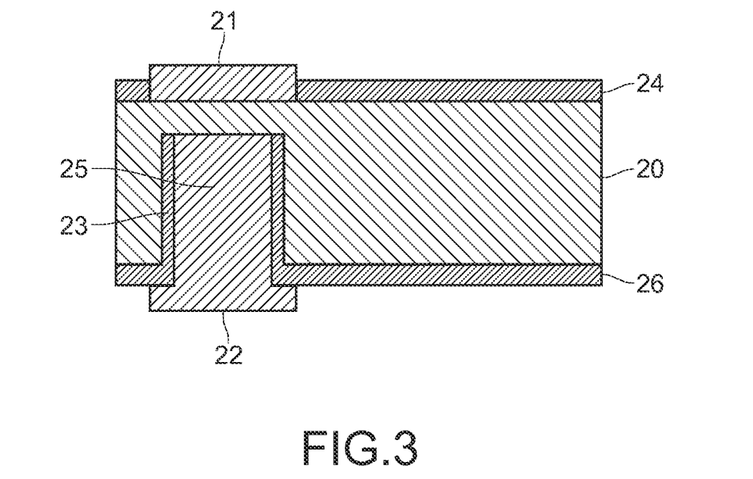
FIG. 3 is a schematic diagram of a semiconductor substrate assembly according to other embodiment of the disclosure.

FIG. 3 is a schematic diagram of a semiconductor substrate assembly according to other embodiment of the disclosure. As compared with the embodiment in FIG. 1, a first insulation layer 24 is formed at remaining portion of the first conductive pad 21 of the first surface, and a second insulation layer 26 is formed at remaining portion of the second conductive pad 22 of the second surface. Through the first insulation layer 24 and the second insulation layer 26, the substrate 20 may be insulated from other substrates or other elements.

Besides, the first insulation layer 24 and the second insulation layer 26 may be removed and whereby the embodiment of FIG. 3 may become the embodiment of FIG. 2A. Moreover, the width (or the diameter) of the inductive pillar 25 in FIG. 1 and FIG. 2B is smaller than that of the first conductive pad 21 or of the second conductive pad 22. This does not limit the width of the first conductive pad 21 and the second conductive pad 22. Hereinafter, if the following embodiments have such a similar condition, this should not limit the width relationship.

Figure 4A:
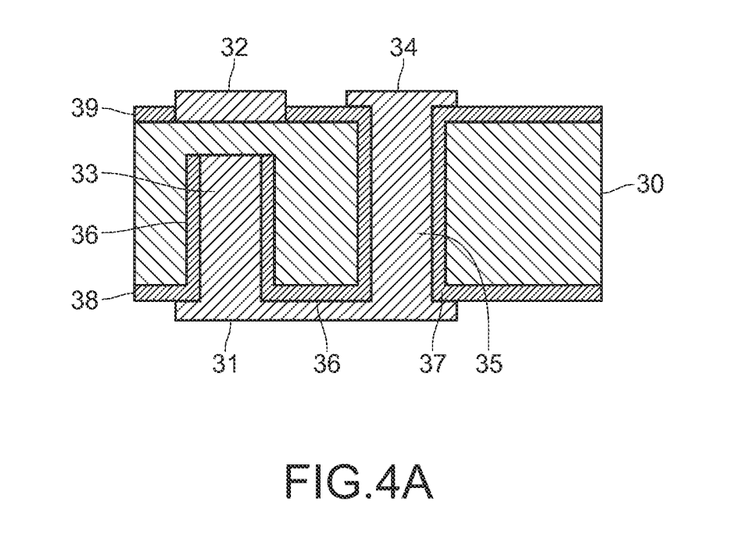
FIG. 4A to FIG. 4C are schematic diagrams of a semiconductor substrate assembly according to other embodiments of the disclosure.

FIG. 4A is a schematic diagram of a semiconductor substrate assembly according to other embodiment of the disclosure. This embodiment is based on the embodiment of FIG. 3, in which two electrodes communicating with external elements are formed at the same surface through another conductive pillar.

The semiconductor substrate assembly includes a substrate 30. In one embodiment, the substrate 30 may be a silicon substrate such as a chip semiconductor, a silicon semiconductor, or a silicon semiconductor interposer. A first conductive pad 31 is formed at a predetermined location of the first surface of the substrate 30, and the size of the first conductive pad 31 is larger than the above embodiments of FIG. 1 to FIG. 3. The first conductive pad 31 is extended by the buried-hole manner to form a second conductive pillar 33. A second conductive pad 32 is formed at a location of the second surface of the substrate 30 as compared with the position of the first conductive pad 31. A first conductive pillar 35 is formed at another location of the second surface by extending the first conductive pad 31 in the substrate 30. A third conductive pad 34 is formed on the second surface of the substrate 30. The third conductive pad 34 electronically connects to the first conductive pillar 35. The third conductive pad 34 and the first conductive pad 31 are formed at the same surface of the substrate 30. The distance between the second conductive pillar 33 and the second conductive pad 32 is about 5 to 10 um.

Because the distance between the second conductive pillar 33 and the first conductive pillar 35 is small, insulation layers are required therebetween. A first insulation layer 37 is formed around first conductive pillar 35. A second insulation layer 36 is formed around the second conductive pillar 33. The second conductive pillar 33 is insulated from the first conductive pillar 35 by the first insulation layer 37. The first insulation layer 37 and the second insulation layer 36 insulate the first conductive pillar 35 from the second conductive pillar 33 and insulate the first conductive pillar 35 and the second conductive pillar 33 from the substrate 30. Moreover, a third insulation layer 38 and a fourth insulation layer 39 are formed at other parts of the surfaces of the substrate 30.

Figure 4B:
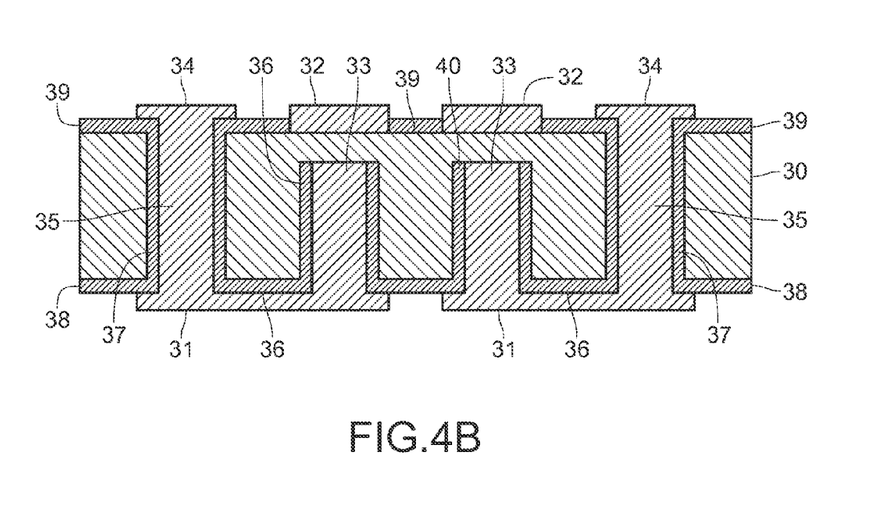

In other embodiment as shown in FIG. 4B, the elements in FIG. 4A may be repeatedly disposed in the substrate 30.

Figure 4C:
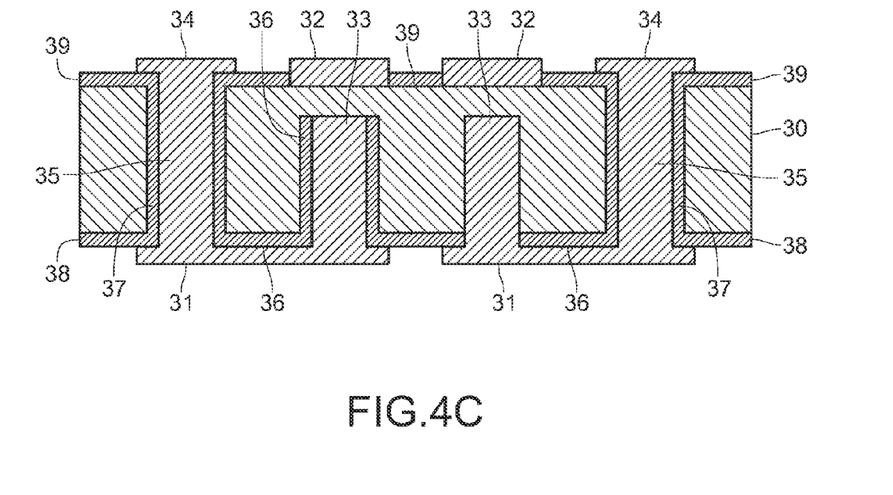

In other embodiment as shown in FIG. 4C, the insulation layer 40 around one of the two second conductive pillar 33 is removed from the embodiment of FIG. 4B. Other elements similar to corresponding elements of FIG. 4B are marked as the same as FIG. 4B.

Figure 5:
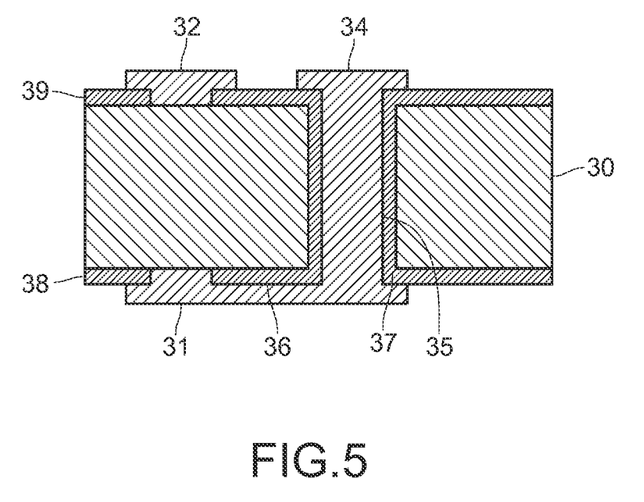
FIG. 5 is a schematic diagram of a semiconductor substrate assembly according to other embodiment of the disclosure.

In other embodiment as shown in FIG. 5, conductive pillars are removed from the embodiment of FIG. 4A, that is, the height of the second conductive pillar 33 of FIG. 4A is 0. The thickness of the substrate 30 may be less than 10 micrometer.

According to FIG. 4A and FIG. 5, the parameters p, d and A are fixed in the equation $R=\rho((d-L)/A)$, and the resistance value R is reduced as the length L is increased. Thus, the resistance value R of the resistance element may be adjusted according to the height of the second conductive pillar 32.

Figure 6A:
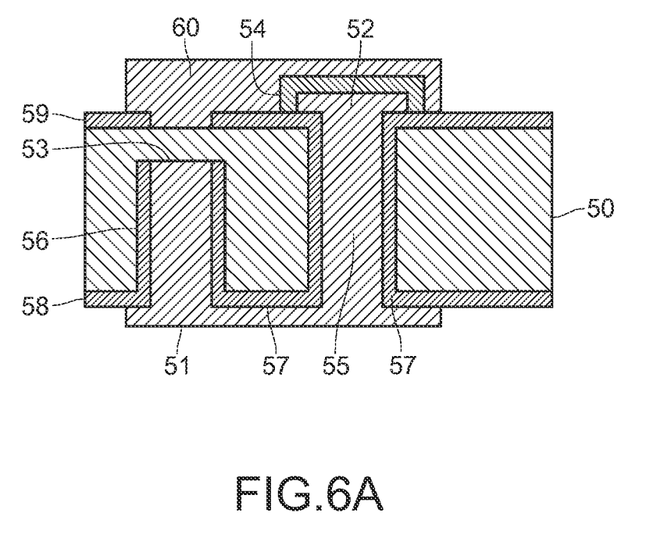
FIG. 6A to FIG. 6C are schematic diagrams of a semiconductor substrate assembly according to other embodiments of the disclosure.

FIG. 6A illustrates a schematic diagram of a semiconductor substrate assembly according to other embodiment of the disclosure. The semiconductor substrate assembly includes a substrate 50. The substrate 50 may be a silicon substrate such as a chip semiconductor, a silicon semiconductor, or a silicon semiconductor interposer.

A first conductive pad 51 is formed at a predetermined location of the first surface of the substrate 50, is extended to form a second conductive pillar 53 by the buried-hole manner, and is extended to form a first conductive pillar 55 at other location of the substrate 50 by a TSV manner. The size of the first conductive pad 51 is larger than the above embodiments in FIG. 1 to FIG. 5. The first conductive pillar 55 is extended to form a second conductive pad 52. The second conductive pad 52 electronically connects to the second conductive pillar 53 through the first conductive pillar 55. A third conductive pad 60 is formed at a predetermined location of the second surface of the substrate 50 as compared with the position of the first conductive pad 51. The second conductive pad 52 and the third conductive pad 60 are at the same surface of the substrate 50. The distance between the second conductive pillar 53 and the third conductive pad 60 is about 5 to 10 micrometer.

A dielectric layer 54 is formed on and covers the second conductive pad 52. Thus, a capacitance element is formed among the second conductive pad 52, the dielectric layer 54 and a part of the third conductive pad 60 opposite to the second conductive pad 52. A resistance element is formed among the first conductive pad 51, the second conductive pillar 53, the third conductive pad 60 and a part of the substrate 50 between the third conducive pad 60 and the second conductive pillar 53. The resistance element and the capacitance element are connected in parallel because of the first conductive pad 51.

The distance between the first conductive pillar 55 and the second conductive pillar 53 is small, so insulation layers are required. A first insulation layer 57 is formed around the first conductive pillar 55. A second insulation layer 56 is formed around the second conductive pillar 53. Thus, the second conductive pillar 53 is insulated from the first conductive pillar 55 by the first insulation layer 57 and the second insulation layer 56. Besides, the first conductive pillar 55 and the second conductive pillar 53 are insulated from the substrate 50 by the first insulation layer 57 and the second insulation layer 56. Moreover, third insulation layers 58 and fourth insulation layers 59 are formed at other parts of two surfaces of the substrate 50.

Figure 6B:
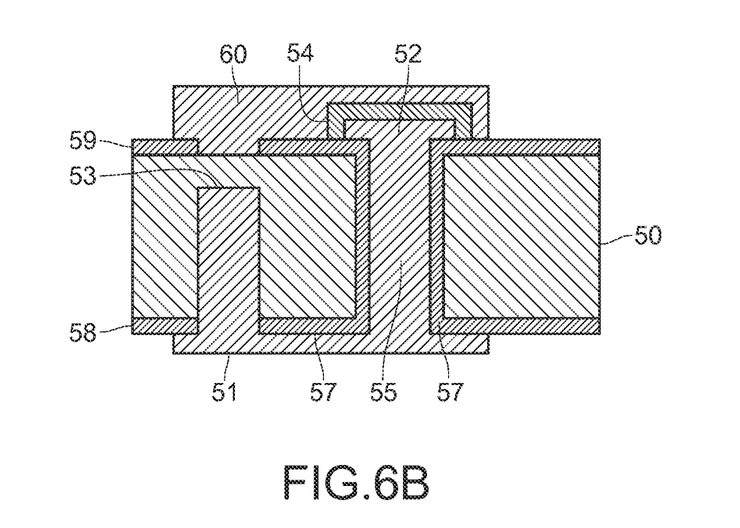

In other embodiment as shown in FIG. 6B, no insulation layer is formed around the second conductive pillar 53 of FIG. 6A.

Figure 6C:
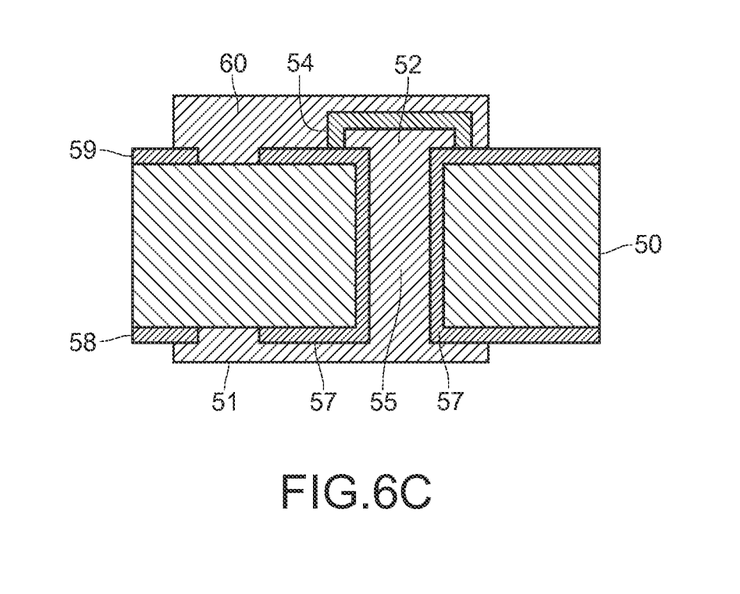

In other embodiment as shown in FIG. 6C, the height of the second conductive pillar 53 of FIG. 6B is 0.

According to FIG. 6B and FIG. 6C, the parameters $\rho$, d and A are fixed in the equation $R=\rho((d-L)/A)$, the resistance value R is reduced while the length L is increased. The resistance value R of the resistance element is changed by various heights of the second conductive pillar 53.

As set forth above, the resistance value is changed by various heights (or lengths) of the conductive pillars, by the thickness of the substrate, or by the distance between the conductive pillar and the conductive pad. The conductive pillars and the conductive pads are used to transmit electronic signals and are made of metal such as gold or copper. Each resistance element and each capacitance element are formed along the direction perpendicular to the substrate.

Various equalization circuits of the semiconductor substrate assembly in the present art are always implemented in a chip circuit and occupy the area of the chip circuit. It does not satisfy the requirement of future package standards to design the equalization circuit in such a condition. In contrast to the present art, the resistance element of the disclosure is formed by the substrate and the conductive pillar. The resistance value of the resistance element may be designed according to the thickness of the substrate and the distance between the conductive pillar and the conductive pad. Thus, the equalization circuit may have the stable resistance value, and the producing of the equalization circuit may become easier.

Moreover, it is not necessary for the resistance element formed by the substrate made of the silicon bulk, to form other elements (or other structures) on chips or on silicon semiconductor interposers. When the silicon bulk is thin enough, the ideal value of the resistance value of the equalization circuit may be some Ohm to 100 Ohm. For example, the thickness of the silicon bulk is, but not limit to, 10 um, 5 um or even 1 um. Thus, the resistance value of the equalization circuit may be adjusted by changing the thickness of the chip or of the silicon semiconductor interposer.

Furthermore, the buried hole is used to adjust the resistance value of the equalization circuit. When the thickness of the chip or of the silicon semiconductor interposer is greater than 10 um, the embodiment with such a buried-hole may reach the advantage of the embodiment using the silicon bulk to form the resistance element. When the silicon bulk is used to form the resistance element, it may be ignored for the front-end fabrication process or for the back-end fabrication process that the fabrication temperature affects the resistance value. Thus, the freeness of designing or performing the fabrication process related to the capacitance element is very high.

Figure 7:
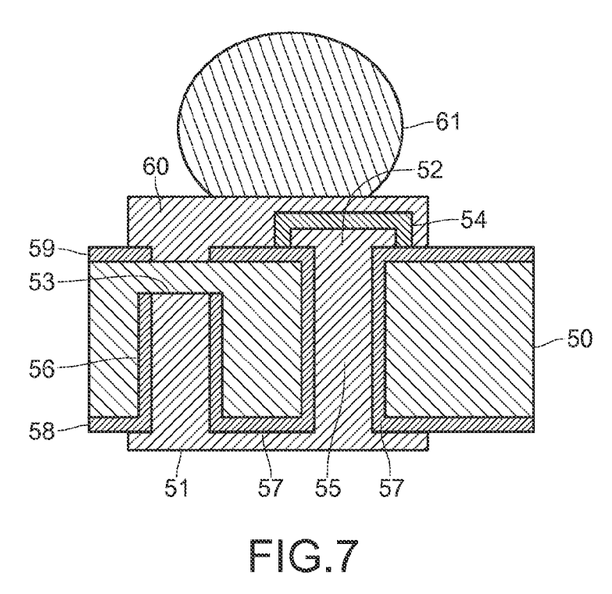
FIG. 7 is a schematic diagram of one implement embodiment of the semiconductor substrate assembly.
Figure 8:
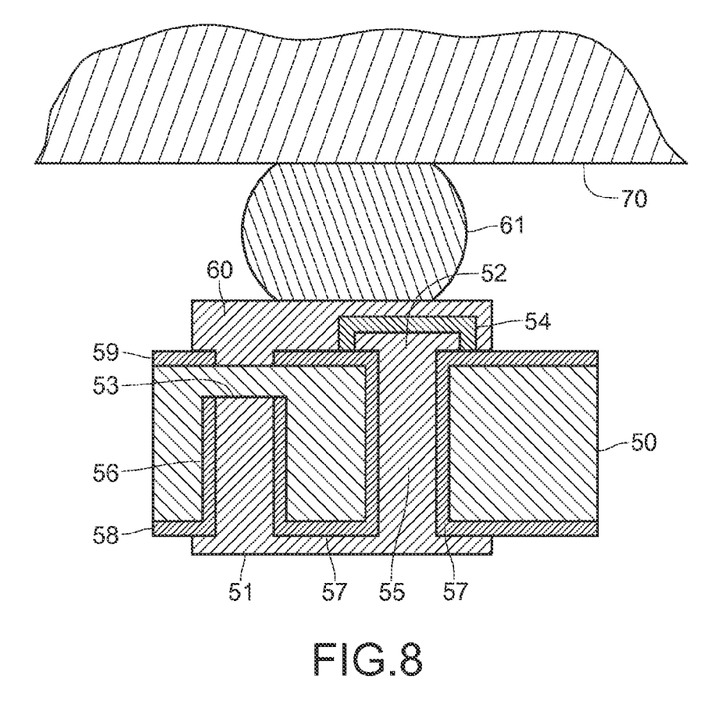
FIG. 8 is a schematic diagram of one implement embodiment of the semiconductor substrate assembly.

FIG. 7 is a schematic diagram of one implement embodiment of the semiconductor substrate assembly. A tin ball or a bump 61 made of solder is used to electronically connect the semiconductor substrate assembly in FIG. 6A to other substrates or other electrical elements. In one embodiment as shown in FIG. 8, the semiconductor substrate assembly in FIG. 7 electronically connects to a chip 70 via the bump 61.

Figure 9:
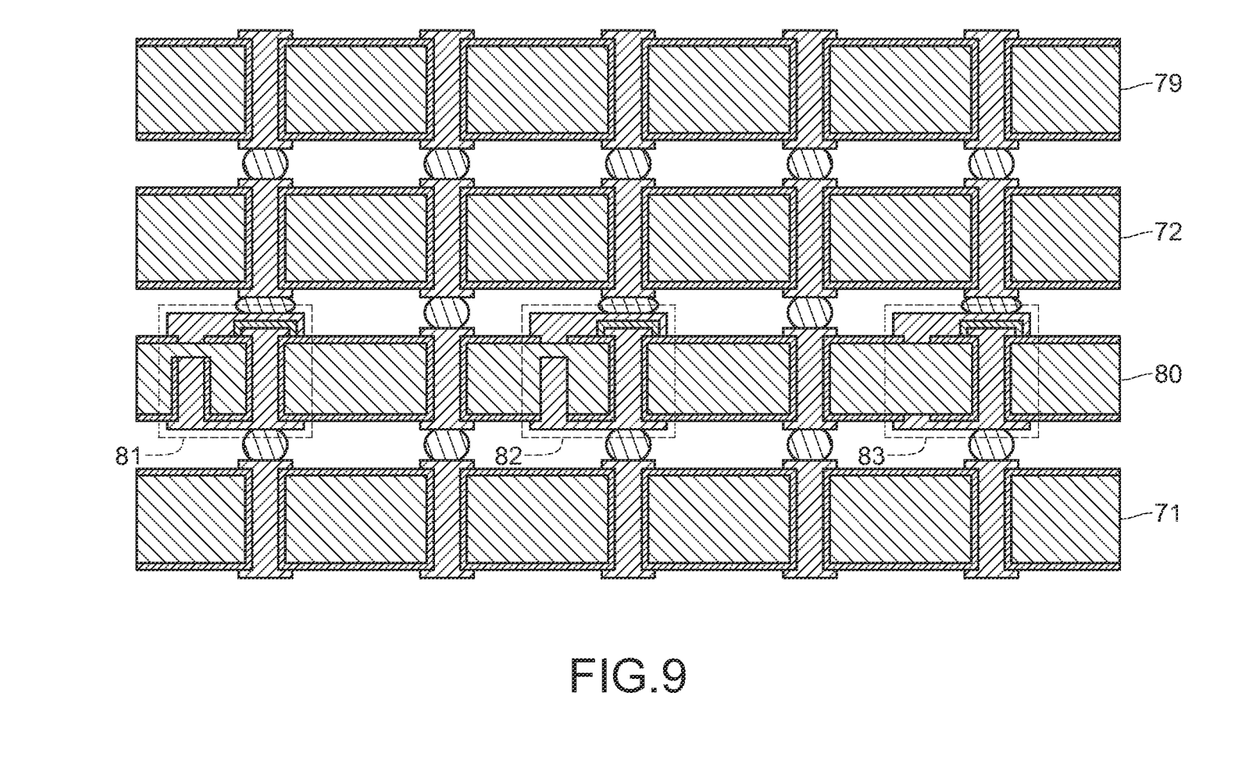
FIG. 9 is a schematic diagram of one implement embodiment of the semiconductor substrate assembly.

FIG. 9 is a schematic diagram of one implement embodiment of the semiconductor substrate assembly. The chips 71, 72 and 79 are laminated. A transmission path for transmitting signals is formed on each chip. The semiconductor substrate assembly 80 described in FIG. 6A is disposed between the chip 71 and the chip 72. The equalization circuit 81 is formed according to FIG. 6A. The equalization circuit 82 is formed according to FIG. 6B. The equalization circuit 83 is formed according to FIG. 6C. The equalization circuit structure in FIG. 9 may increase the quality of transmitting signals in high speed on the transmission path.

This disclosure uses the substrate to form the resistance element required in an equalization circuit. In other embodiment, the depth of a buried hole or the thickness of chip (the height of TSV) is used to adjust the resistance value of the resistance element. In other embodiment, an insulation material is formed on the conductive pad of the equalization circuit directly so as to form a capacitance element in the equalization circuit. In other embodiment, the resistance element and the capacitance element are formed in the equalization circuit as which a resistor and a capacitor connected in parallel. The passive elements, e.g. the resistance element or the capacitance element, required by the equalization circuit in each embodiment of the disclosure may be produced by an IC back-end fabrication process or a package fabrication process. This may reduce the manufacture costs.

Besides, the disclosure may be carried out via the back-end fabrication process. Thus, the resistance element and the capacitance element may be designed according to various chip package standards of the three-dimension integration circuit, such as various chip thicknesses, various amounts of laminated chips and various aspect ratios of TSVs.

The disclosure may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and region of equivalency of the claims are to be embraced within their scope.

What is claimed is:

1. A semiconductor substrate assembly, comprising:
   a substrate, having a first surface and a second surface opposite to the first surface;
   a first conductive pad, formed at a predetermined location of the first surface of the substrate;
   a second conductive pad, formed at a predetermined location of the second surface of the substrate, wherein the predetermined location of the second surface corresponds to the predetermined location of the first surface where the first conductive pad is; and
   a conductive pillar, formed in the substrate and contacting with one of the first conductive pad and the second conductive pad;
   wherein a resistance element is formed among the first conductive pad, the second conductive pad, the conductive pillar and the substrate overlapped between the first conductive pad and the conductive pillar, and a resistance value of the resistance element is reduced while a length of the conductive pillar is increased.

2. The semiconductor substrate assembly according to claim 1, wherein a distance between the conductive pillar and the first conductive pad is from 5 micrometer to 10 micrometer.

3. The semiconductor substrate assembly according to claim 1, further comprising:
   an insulation layer, formed around the conductive pillar.

4. The semiconductor substrate assembly according to claim 3, wherein a distance between the conductive pillar and the first conductive pad is from 5 micrometer to 10 micrometer.

5. The semiconductor substrate assembly according to claim 1, further comprising:
   a first insulation layer, formed at remaining portion of the first surface of the substrate; and
   a second insulation layer, formed at remaining portion of the second surface of the substrate.

6. The semiconductor substrate assembly according to claim 5, wherein a distance between the conductive pillar and the first conductive pad is from 5 micrometer to 10 micrometer.

7. The semiconductor substrate assembly according to claim 1, wherein a length of the conductive pillar is zero, and a resistance value of the resistance element is changed according to a thickness of the substrate.

8. A semiconductor substrate assembly, comprising:
   a substrate, having a first surface and a second surface opposite to the first surface;
   a first conductive pad, formed at a predetermined location of the first surface of the substrate;
   a second conductive pad, formed at a predetermined location of the second surface of the substrate, wherein the predetermined location corresponds to the predetermined location of the first surface where the first conductive pad is;
   a third conductive pad, formed at the second surface of the substrate;
   a first conductive pillar, formed in the substrate and electrically connecting to one of the first conductive pad and the third conductive pad;
   a first insulation layer, formed around the first conductive pillar;
   a third insulation layer, formed at remaining portion of the first surface of the substrate;
   a fourth insulation layer, formed at remaining portion of the second surface of the substrate; and
   a second conductive pillar, formed in the substrate and contacting with the first conductive pad;
   wherein a resistance element is formed among the first conductive pad, the second conductive pillar, the third conductive pad and a part of the substrate between the third conducive pad and the second conductive pillar, and a resistance value of the resistance element is reduced while a length of the second conductive pillar is increased.

9. The semiconductor substrate assembly according to claim 8, wherein a second insulation layer is formed around the second conductive pillar.

10. The semiconductor substrate assembly according to claim 8, wherein a distance between the second conductive pillar and the second conductive pad is from 5 micrometer to 10 micrometer.

11. The semiconductor substrate assembly according to claim 8, wherein the length of the second conductive pillar is zero, and a resistance value of the resistance element is changed according to a thickness of the substrate.

* * * * *